United States Patent
Nagano et al.

(10) Patent No.: US 7,598,562 B2
(45) Date of Patent: Oct. 6, 2009

(54) SEMICONDUCTOR DEVICE AND METHOD OF MANUFACTURING THE SAME

(75) Inventors: Hajime Nagano, Mie (JP); Takeo Furuhata, Mie (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 44 days.

(21) Appl. No.: 11/769,423

(22) Filed: Jun. 27, 2007

(65) Prior Publication Data
US 2007/0296016 A1    Dec. 27, 2007

(30) Foreign Application Priority Data
Jun. 27, 2006    (JP) .............................. 2006-176648

(51) Int. Cl.
*H01L 21/8247* (2006.01)
(52) U.S. Cl. ...................... 257/315; 438/259; 438/587; 438/296; 438/593; 438/792; 257/E29.129; 257/E29.309; 257/E21.625; 257/E21.422
(58) Field of Classification Search ................ 438/259, 438/587, 296, 593, 792, FOR. 203; 257/315, 257/E29.129, E29.309, E21.625, E21.422
See application file for complete search history.

(56) References Cited

U.S. PATENT DOCUMENTS

| | | | | |
|---|---|---|---|---|
| 5,422,291 A | * | 6/1995 | Clementi et al. | 438/591 |
| 5,498,560 A | * | 3/1996 | Sharma et al. | 438/261 |
| 5,621,233 A | * | 4/1997 | Sharma et al. | 257/316 |
| 5,847,427 A | * | 12/1998 | Hagiwara | 257/324 |
| 6,121,087 A | * | 9/2000 | Mann et al. | 438/258 |
| 6,395,654 B1 | * | 5/2002 | Yang et al. | 438/306 |
| 6,525,369 B1 | * | 2/2003 | Wu | 257/315 |
| 2001/0024857 A1 | * | 9/2001 | Parat et al. | 438/259 |
| 2002/0135013 A1 | * | 9/2002 | Chiu | 257/316 |
| 2002/0160570 A1 | * | 10/2002 | Tseng | 438/257 |

(Continued)

FOREIGN PATENT DOCUMENTS

EP    571692 A1 * 12/1993

(Continued)

OTHER PUBLICATIONS

S. F. Ting, et al., "The Effect of Remote Plasma Nitridation on the Integrity of the Ultrathin Gate Dielectric Films in 0.13 μm CMOS Technology and Beyond," IEEE Electron Device Letters, vol. 22, No. 7, Jul. 2001, pp. 327-329.

*Primary Examiner*—George Fourson
(74) *Attorney, Agent, or Firm*—Oblon, Spivak, McClelland, Maier & Neustadt, L.L.P.

(57) ABSTRACT

A semiconductor device including a semiconductor substrate; an element isolation region having a trench filled with an insulating film defined on the semiconductor substrate; a memory cell transistor formed in an element forming region isolated by the element isolating regions of the semiconductor substrate; and the memory cell transistor includes a gate insulating film formed on a surface of the element forming region; a floating gate formed over the gate insulating film; an inter-gate insulating film formed integrally so as to cover the floating gate and the insulating film of the element isolation region and having high dielectric constant in a portion corresponding to the floating gate and low dielectric constant in a portion corresponding to the insulating film of the element isolation region; and a control gate stacked over the floating gate via the inter-gate insulating film.

9 Claims, 5 Drawing Sheets

U.S. PATENT DOCUMENTS

| | | | |
|---|---|---|---|
| 2003/0183869 A1* | 10/2003 | Crivelli et al. | 257/314 |
| 2003/0193064 A1* | 10/2003 | Wu | 257/315 |
| 2004/0004265 A1* | 1/2004 | Lee et al. | 257/510 |
| 2005/0218442 A1* | 10/2005 | Hieda | 257/306 |
| 2006/0205155 A1* | 9/2006 | Makabe et al. | 438/257 |
| 2006/0220093 A1* | 10/2006 | Van Schaijk et al. | 257/315 |
| 2006/0240619 A1 | 10/2006 | Ozawa et al. | |
| 2006/0246665 A1* | 11/2006 | Crivelli et al. | 438/261 |
| 2007/0202646 A1* | 8/2007 | Tseng | 438/257 |
| 2008/0067576 A1* | 3/2008 | Yaegashi | 257/316 |
| 2008/0197400 A1* | 8/2008 | Aritome | 257/315 |

FOREIGN PATENT DOCUMENTS

| | | |
|---|---|---|
| JP | 8-17945 | 1/1996 |
| JP | 2000-100976 | 4/2000 |
| JP | 2001-15616 | 1/2001 |
| JP | 2004-319586 | 11/2004 |
| JP | 2005-026590 | 1/2005 |

* cited by examiner

SEMICONDUCTOR DEVICE AND METHOD OF MANUFACTURING THE SAME

CROSS-REFERENCE TO RELATED APPLICATIONS

This application is based upon and claims the benefit of priority from the prior Japanese Patent Application No. 2006-176648, filed on, Jun. 27, 2006 the entire contents of which are incorporated herein by reference.

FIELD

The present disclosure is directed to a semiconductor device, more particularly to a non-volatile storage device employing an improved insulating film structure formed between a floating gate and a control gate that constitute a gate electrode in a memory cell transistor. The present disclosure is also directed to a method of manufacturing such semiconductor device.

BACKGROUND

A typical non-volatile memory device such as a flash memory has seen widespread use by application to multimedia cards because of its capability to retain memory without power supply. In order to meet the recent growing demand for larger memory capacity, further densification of memory cells is required. A general technical problem encountered in achieving densification is the "increase in Yupin effect". The technical problem involves erroneous writing caused by narrowed spacing between the neighboring elements at the expense of densification More specifically, the narrowed spacing of the neighboring elements increases the parasitic capacitance therebetween and causes unintended writing of a memory cell affected by writing of neighboring memory cell.

A transistor that configures a memory cell of a flash memory is provided with a floating gate and a control gate which generally employ polycrystalline silicon. Also, in case the memory cell manufacturing steps proceed in the bit-line direction and thereafter the word-line direction, an inter-poly insulating film serving as an inter-gate insulating film interposing the floating gate and the control gate has been conventionally formed entirely over the surfaces of the floating gate and the element isolation region in a single film forming step after the floating gate has been processed.

In order to reduce electricity required in writing or erasing the floating gate, increased coupling ratio is required; the coupling ratio being the ratio between the capacitance between the floating gate and the control gate, and the capacitance between the floating gate and the silicon substrate. Thus, it is desirable to increase the dielectric constant of the inter-poly insulating film. One of such techniques, for instance, can be found in "The Effect of Remote Plasma Nitridation on the Integrity of the Ultrathin Gate Dielectric Films in 0.13 μm CMOS Technology and Beyond", IEEE ELECTRON DEVICE LETTERS, VOL. 22, No. 7, July 2001, p. 327-329 by S. F. Ting and 11 other authors" in which dielectric constant is increased by converting the oxide film into a nitride film.

However, in case a method is employed in which an insulating film overlying the floating gate and an insulating film overlying the element isolation region are formed in a single step as described earlier, dielectric constant of inter-poly insulating film as well as dielectric constant of the insulating film overlying the STI are increased, consequently increasing the parasitic capacitance between the neighboring cells.

To avoid such problem, insulating film of low dielectric constant needs to be formed over the element isolation region whereas insulating film of high dielectric constant needs to be formed between the floating gate and the control gate. However, selective formation of insulating films of varying dielectric constant is likely to require increased number and complexity of steps, which calls for a specific method to meet such objectives in a simple fashion.

SUMMARY

A semiconductor device and a method of manufacturing the same has been conceived in the present disclosure to address the above concerns by forming an insulating film of low dielectric constant over the element isolation region, and forming an inter-gate insulating film of high dielectric constant between the floating gate and the control gate in a simple structure and in simple manufacturing steps.

In one aspect, a semiconductor device of the present disclosure includes a semiconductor substrate; an element isolation region having a trench filled with an insulating film defined on the semiconductor substrate; a memory cell transistor formed in an element forming region isolated by the element isolation regions of the semiconductor substrate; and the memory cell transistor includes a gate insulating film formed or a surface of the element forming region; a floating gate formed over the gate insulating film; an inter-gate insulating film formed integrally so as to cover the floating gate and the insulating film of the element isolation region and having high dielectric constant in a portion corresponding to the floating gate and low dielectric constant in a portion corresponding to the insulating film of the element isolation region; and a control gate stacked over the floating gate via the inter-gate insulating film.

In another aspect, a semiconductor device of the present disclosure includes a semiconductor substrate including a first upper surface having an element forming region and an element isolation region being adjacent to the element forming region, the element isolation region having a trench; an element insulating film formed in the trench, including a second upper surface being higher than the first upper surface of the semiconductor substrate in the element forming region and a first side surface protruding from the first upper surface; a gate insulating film formed on the first upper surface of the semiconductor substrate in the element forming region; a floating gate electrode formed on the gate insulating film, including a third upper surface being higher than the second upper surface related to the first upper surface, a lower side surface facing to the first side surface and an upper side surface exposed from the element insulating film; an inter-gate insulating film formed on the third upper surface and the upper side surface of the floating gate electrode and the second upper surface of the element insulating film, the inter-gate insulating film including a first portion located or the third upper surface of the floating gate electrode and a second portion located on the second upper surface of the element insulating film; and a control gate electrode formed on the inter-gate insulating film, wherein a first dielectric constant of the first portion of the inter-gate insulating film is higher than a second dielectric constant of the second portion of the inter-gate insulating film.

Yet, in another aspect, a method of manufacturing a semiconductor device of the present disclosure includes forming a gate insulating film and a film serving as a floating gate electrode on a semiconductor substrate; forming an element isolation region by defining a trench on the semiconductor substrate and filling the trench with an insulating film; processing a height of an upper surface of the element isolation region to be lower than an upper surface of the film serving as the floating gate electrode; forming an insulating film having low dielectric constant that serves as an inter-gate insulating film over entire surface; processing the insulating film serving as the inter-gate insulating film having low dielectric constant by a nitriding process so that a dielectric constant of a portion overlying the film serving as the floating gate electrode becomes high; and forming a film serving as a control gate electrode.

BRIEF DESCRIPTION OF THE DRAWINGS

Other objects, features and advantages of the present disclosure will become clear upon reviewing the following description of the embodiment of the present disclosure with reference to the accompanying drawings, in which.

DETAILED DESCRIPTION

One embodiment of the present disclosure will be described with reference to FIGS. 1 to 11.

Figure 1:
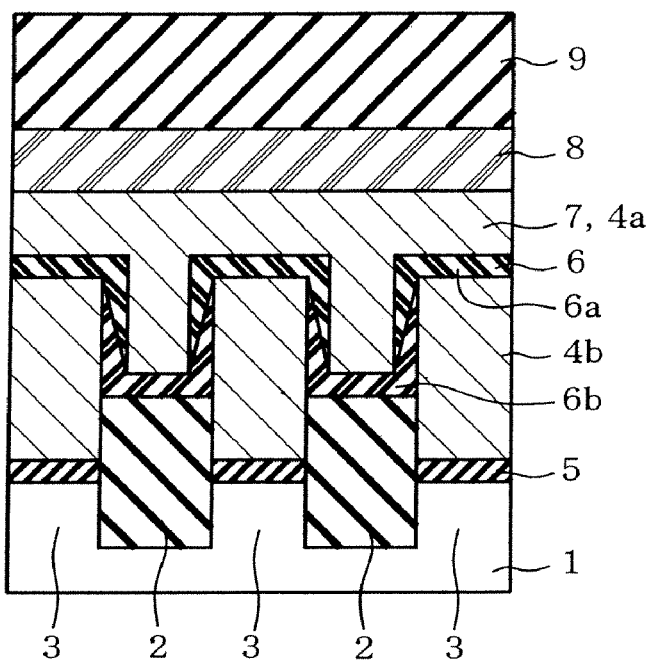
FIG. 1 is a schematic cross sectional view illustrating a first embodiment of the present disclosure.
Figure 2:
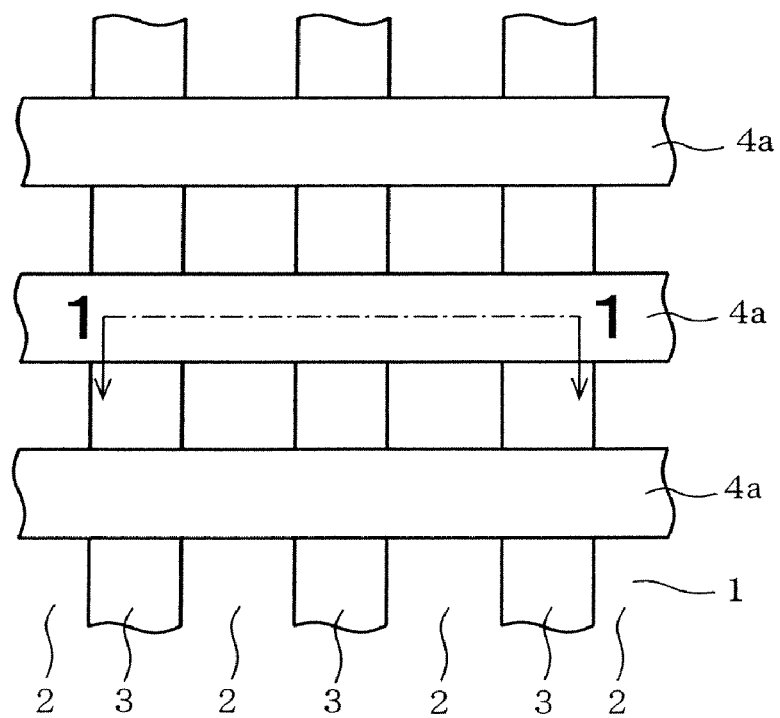
FIG. 2 is a schematic plan view.

FIGS. 1 and 2 are schematic views illustrating a portion of a memory cell region of the flash memory in cross-sectional view and in plan view respectively. The cross section illustrated in FIG. 1 is taker along lire 1-1 of FIG. 2.

Referring to FIG. 2, STI (Shallow Trench Isolation 2 serving as an element isolation region is defined at predetermined intervals or a silicon substrate 1 serving as the semiconductor substrate, whereby multiple strip-formed active regions 3 (corresponding to an element forming region) are defined by being isolated from one another. A control gate electrode 4a of a gate electrode 4 is defined in a direction perpendicular to the direction in which the active regions 3 are formed.

Next, referring to FIG. 1, a tunnel gate insulating film 5 is formed over the surface of the active region 3 of the silicon substrate 1 and a floating gate electrode 4b composed of polycrystalline silicon is formed over the tunnel gate insulating film 5. The upper surface of the floating gate electrode 4b is higher than the upper surface of the STI 2. Thus, the portion where the STI 2 is formed is recessed relative to the floating gate electrode 4b.

An inter-gate insulating film 6 is formed on the upper and side surfaces of the floating gate electrode 4b and the upper surface of the STI 2. The inter-gate insulating film 6 is formed by a continuous film but is formed so that dielectric constants partially vary. More specifically, a film 6a on the upper surface and the upper portion of the side surface of the floating gate electrode 4b is formed to have a high dielectric constant (corresponding to a first dielectric constant) and a film 6b on the upper surface of the STI 2 and in the lower portion of the side surface of the floating gate electrode 4b is formed to have low dielectric constant (corresponding to a second dielectric constant) which is lower than the high dielectric constant of the film 6a. Examples of such films 6a and 6b are: a silicon nitride film, or the like, for the high dielectric constant film 6a; and a silicon oxide film, or the like, for the low dielectric constant film 6b. Such inter-gate insulating film 6, as will be described hereinafter, employs a technique where an insulating film once formed entirely over the underlying structure is partially processed.

The control gate electrode 4a is formed by depositing polycrystalline silicon film over the inter-gate insulating film 6 and is arranged to be formed across the neighboring floating gate electrodes 4b. A silicide film 8 and a silicon nitride film 9 are sequentially laminated over the upper surface of the control gate electrode 4b. More specifically, the control gate electrode 4b, the silicide film 8 and the insulating film 9 are isolated after being laminated as shown in FIG. 2.

A memory cell transistor having the above configuration has the inter-gate insulating film 6a having high dielectric constant between the floating gate electrode 4b and the control gate electrode 4a. Thus, a large static capacitance is observed in this portion. As a result, increased coupling ratio can be achieved. Also, since the inter-gate insulating film 6b over the STI 2 has low dielectric constant, the Yupin effect between the neighboring memory transistors can be degraded.

Next, the manufacturing steps for the above described configuration will be described with reference to FIGS. 3 to 10.

Figure 3:
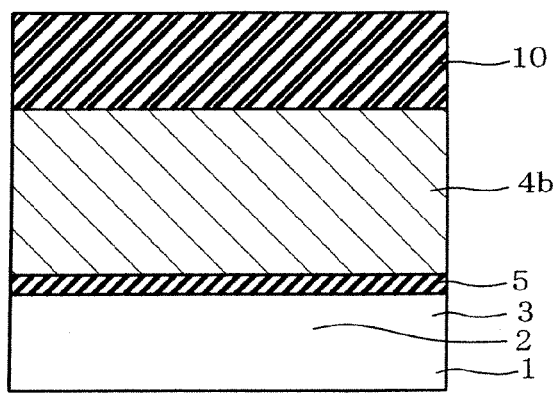
FIG. 3 corresponds to FIG. 1 showing one phase of a manufacturing process.

Referring to FIG. 3, a tunnel gate insulating film 5 is formed over the silicon substrate 1 and an amorphous silicon film (4b) serving as the floating gate electrode 4b and a silicon nitride film 10 used as a mask for processing the amorphous silicon film are sequentially laminated over the tunnel gate insulating film 5.

Figure 4:
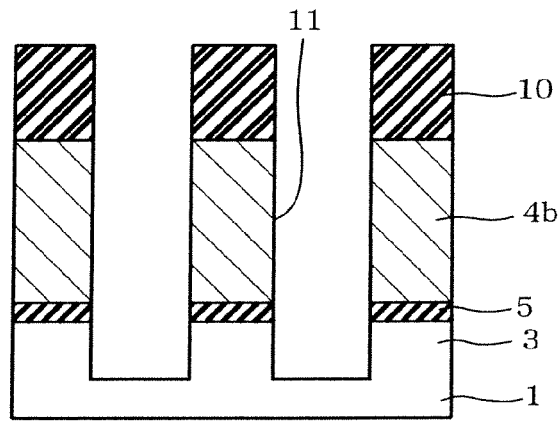
FIG. 4 corresponds to FIG. 1 showing one phase of a manufacturing process ($2^{nd}$ variation)

Next, referring to FIG. 4, a photo resist not shown is coated by photolithography process and thereafter patterned to form the STI 2. Using the patterned resist and the silicon nitride film as a mask, the silicon nitride film 10, the amorphous silicon film 4b, the tunnel gate insulating film 5 and the silicon substrate 1 are etched by a predetermined depth by RIE (Reactive Ion Etching) process. Thus, a trench 11 constituting the element isolation region, in other words, the STI 2 is formed, consequently defining isolated active regions 3 or the substrate 1 surface. The amorphous silicon film is later converted to polycrystalline silicon film by thermal processing.

Figure 5:
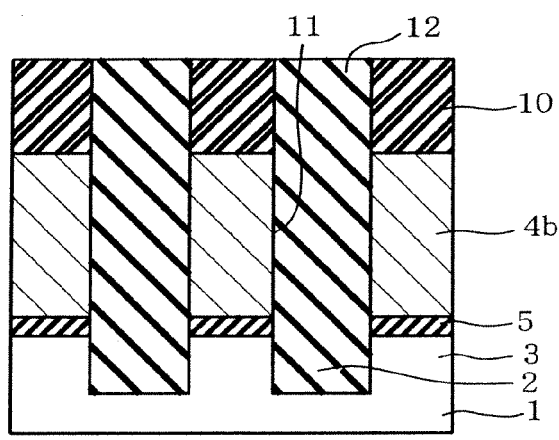
FIG. 5 corresponds to FIG. 1 showing one phase of a manufacturing process ($3^{rd}$ variation)

Next, referring to FIG. 5, element isolation insulating film 12 is deposited to fill the trench 11 and is thereafter polished by CMP (Chemical Mechanical Polishing) process by using the silicon nitride film 10 as a stopper so that only the element isolation insulating film 12 remains inside the trench 11, in other words, the element isolation insulating film 12 and the silicon nitride film 10 are processed to be at level.

Figure 6:
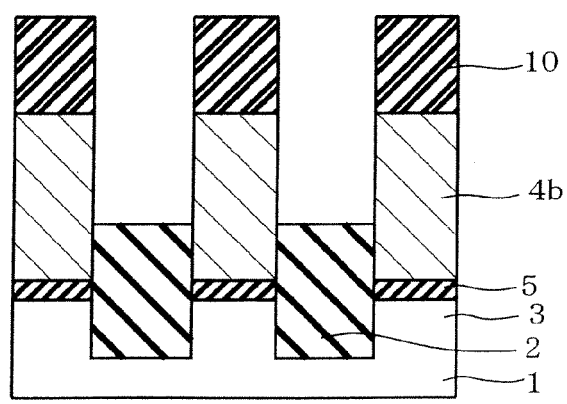
FIG. 6 corresponds to FIG. 1 showing one phase of a manufacturing process ($4^{th}$ variation)
Figure 7:
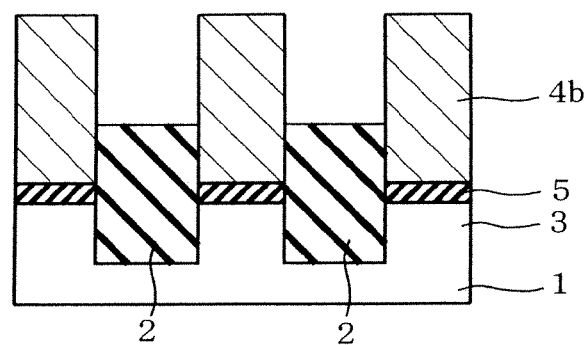
FIG. 7 corresponds to FIG. 1 showing one phase of a manufacturing process ($5^{th}$ variation)

Subsequently, referring to FIG. 6, the element isolation insulating film 12 filled in the trench 11 is etched to be at level with the vertical mid-portion of the floating gate electrode 4b. Then, as shown in FIG. 7, the silicon nitride film 10 is removed by wet etch employing solution of phosphoric acid.

Figure 8:
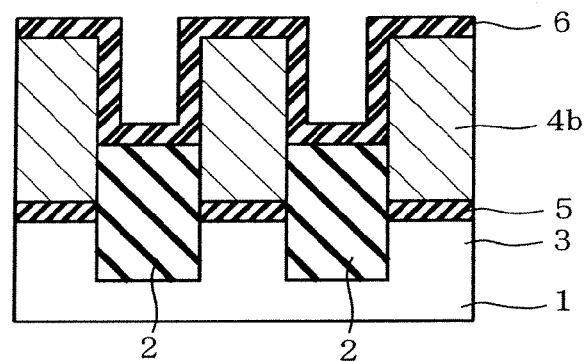
FIG. 8 corresponds to FIG. 1 showing one phase of a manufacturing process ($6^{th}$ variation)

Next, as shown in FIG. 8, the silicon oxide film 6 is formed in a predetermined film thickness entirely over the floating gate electrode 4b and the STI 2. In FIG. 8 onwards, the film thickness of the floating gate electrode 4b has been increased conspicuously as compared to FIGS. 3 to 7 for the convenience of explanation. In such case, the silicon oxide film 6 is formed by the following method, for example.

For example, the temperature inside the chamber of a film forming unit not shown is heated to 600 to 850° C., and 50 to 500 sccm of dichlorosilane ($SiH_2Cl_2$) and 100 to 1000 sccm of nitrogen oxide ($N_2O$) are introduced inside the chamber. Thus, silicon oxide film is laminated continuously in the periphery of the floating gate electrode 4b and over the surface of the STI 2.

Figure 9:
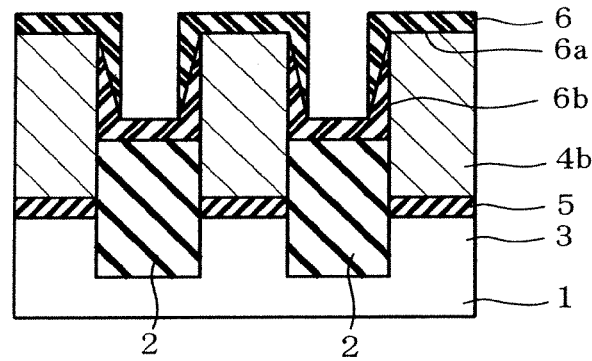
FIG. 9 corresponds to FIG. 1 showing one phase of a manufacturing process ($7^{th}$ variation)

Next, referring to FIG. 9, nitriding process that is performed by radiating radical or ionized nitrogen is performed by SPA (Slot Plane Antenna) nitridation process. More specifically, for example, the temperature inside the unit is set to 250 to 600° C. with the electrical output of the unit ranging from 500 to 4000 W. Under such condition, nitriding process is performed with 500 to 3000 sccm of Ar gas and 10 to 300 sccm of $N_2$ gas in 1 m Torr to 10 Torr for 5 sec to 600 sec. In this step, most of the silicon oxide film 6a over the floating gate electrode 4b is nitrided in the direction of thickness to be converted to silicon nitride film, however, since the nitride species do not reach the silicon oxide film 6b over the STI 2, the silicon oxide film 6b remains as silicon oxide film 6b since almost no nitriding reaction takes place.

Among the parameters specified in the above described conditions for performing the nitriding process, the value of pressure specified in nitridation is of critical importance. By increasing the pressure, the deficit between nitridation amount over the floating gate electrode 4b and the nitridation amount over the STI 2 can be increased. The deficit in the amount of nitridation will also occur depending upon the aspect ratio of the underlying profile at the time of film formation. For example, suppose the amount of nitridation over the STI 2 is "1" when the aspect ratio of the STI 2 is "2". It has been found by measurement carried out by the inventors that under such circumstance, if the aspect ratio takes the value of 50 and 90, the amount of nitridation over the STI 2 is reduced to approximately ⅓ and ⅙ respectively (refer to FIG. 11).

Figure 10:
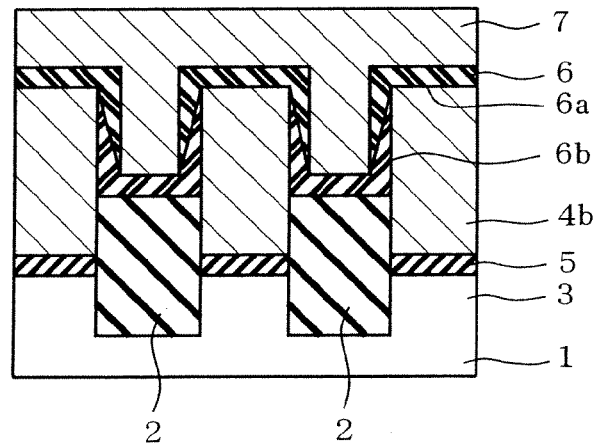
FIG. 10 corresponds to FIG. showing one phase of a manufacturing process ($8^{th}$ variation)
Figure 11:
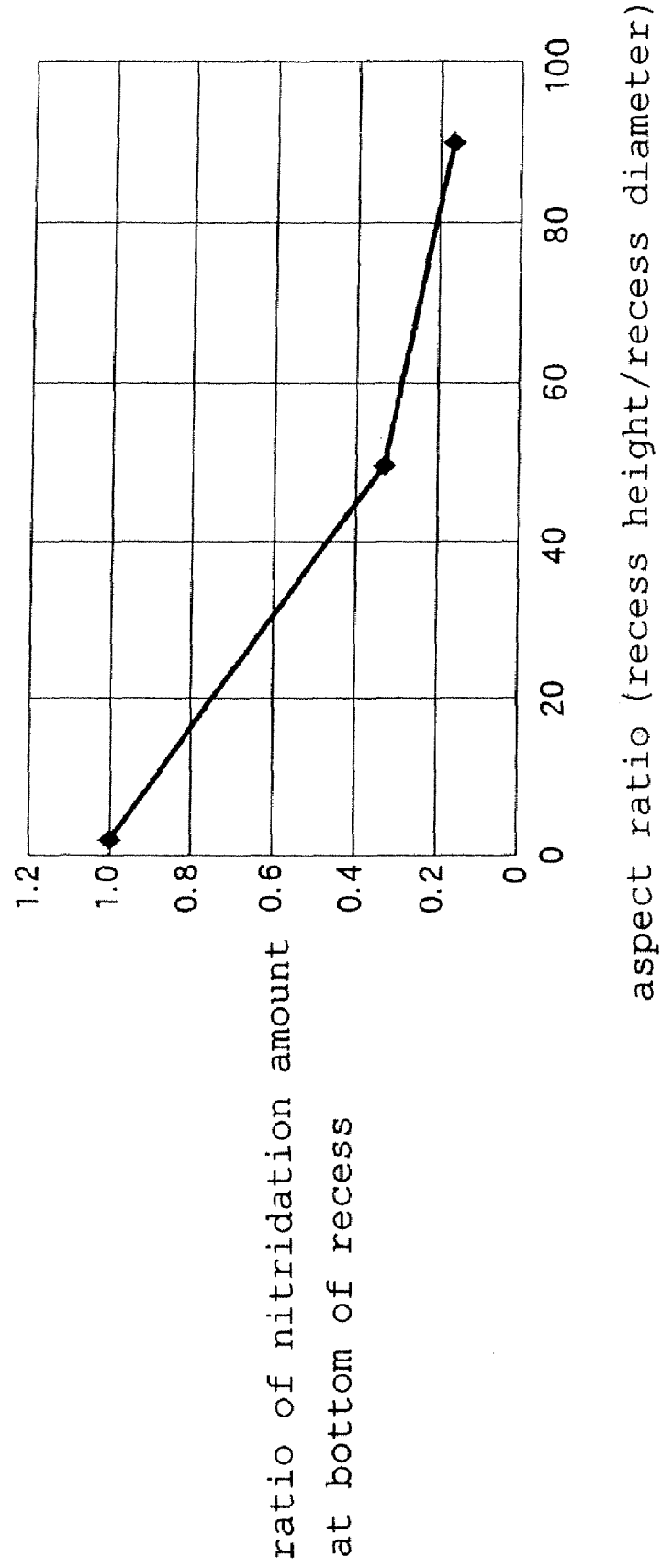
FIG. 11 is a graph showing a characteristic correlation of aspect ratio and amount of nitridation.

Next, referring to FIG. 10, amorphous silicon film 7 serving as a control gate electrode 4a is deposited whereafter a silicide film 8 and an insulating film 9 are laminated. Thereafter, ordinary processing such as converting amorphous silicon film 7 to polycrystalline silicon film is carried out to obtain the configuration illustrated in FIG. 1.

As described above, in the present embodiment, after forming the silicon oxide film, the silicon oxide film is formed as a continuous inter-gate insulating film 6 while the upper surface and the side surface of the floating gate electrode 4b are treated so as to be partially highly dielectric by performing selective SPA nitridation. At this time, the upper surface of the floating gate electrode 4b has been formed in a steeped structure being higher than the upper surface of the STI 2. This, nitridation is promoted significantly in the proximity of the upper surface of the floating gate electrode 4b whereas nitridation is restrained in the proximity of the bottom of the stepped structure.

Under the above described configuration, the silicon oxide film 6a constituting the inter-gate insulating film 6 overlying the floating gate electrode 4a of serves as an inter-poly insulating film having high dielectric constant of approximately 7.0 to 8.0 (dielectric constant of the $Si_3N_4$ is 7.9 film). Thus, the coupling ratio of the memory transistor can be increased and the semiconductor device can be operated in the same speed with lower consumption of electricity.

On the other hand, the silicon oxide film 6b overlying the STI 2 of the inter-gate insulating film 6 can be formed as an insulating film having low dielectric constant of approximately 3.9 to 4.0 (dielectric constant of the $SiO_2$ film is 3.9), allowing reduction of parasitic capacitance between the neighboring memory transistors and malfunctioning of the semiconductor device where the neighboring device is written erroneously due to Yupin effect.

Figure 12:
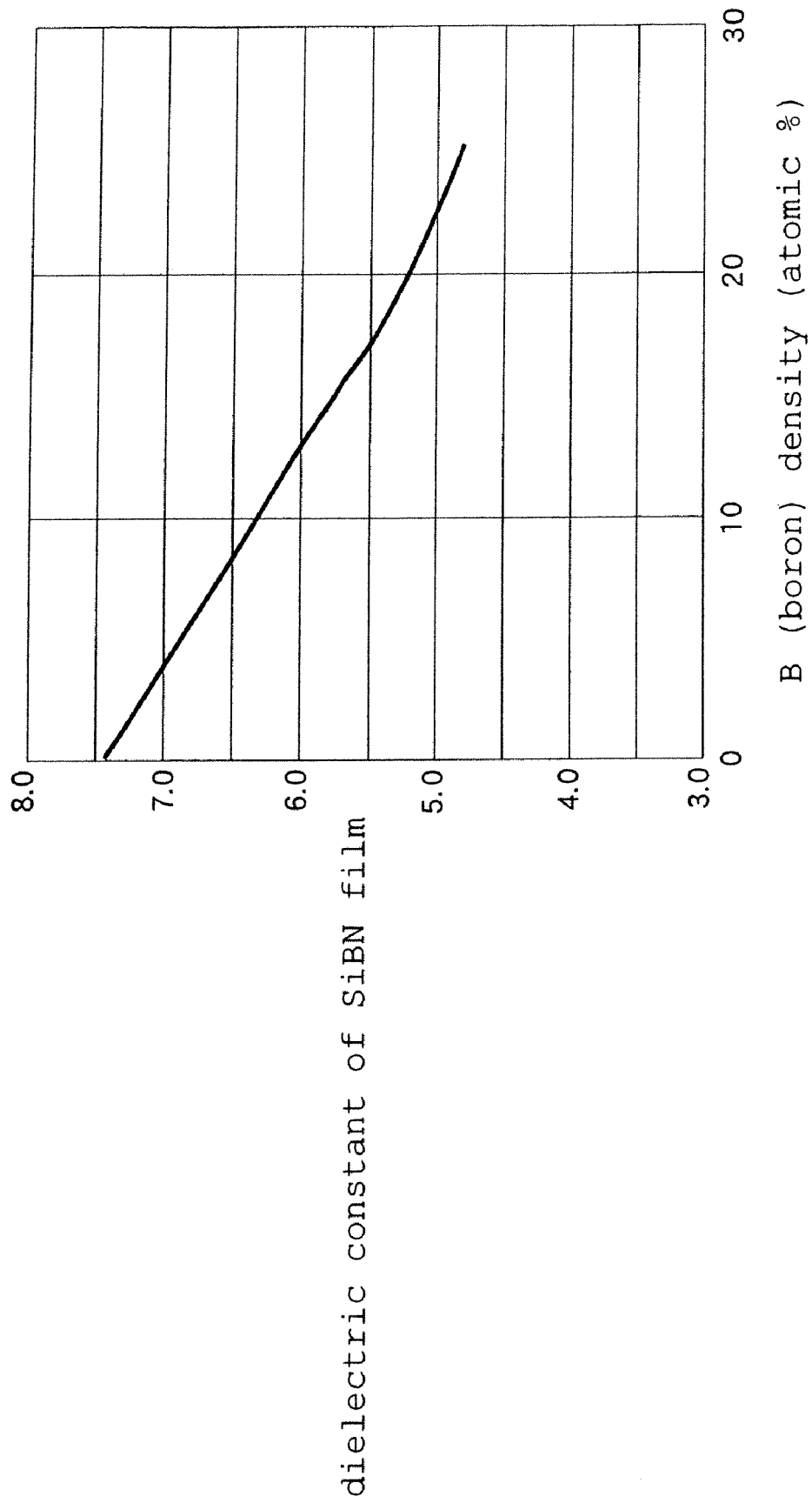
FIG. 12 is a graph showing a characteristic correlation of B density and SiBN film dielectric constant of a second embodiment.

FIG. 12 illustrates a second embodiment of the present disclosure. The second embodiment of varies from the first embodiment in that, SiBN (silicon boron nitride) is formed instead of the silicon oxide film when forming the inter-gate insulating film 6. In such case, by employing SiBN film as a basis of the insulating film, the dielectric constant of the SIBN film itself car be controlled independently, apart from controlling the dielectric constant of the insulating film under the conditions of the SPA nitridation, thereby enhancing the capability of the manufacturing process.

The steps up to defining the STI 2 on the silicon substrate 1 are the same as the first embodiment. The dielectric constant of the SiBN film serving as the inter-gate insulating film can be controlled by controlling the density of B (boron) dopant More specifically, by changing the density of B in the SIBN film in the range of 0 to 30%, dielectric constant can be adjusted freely in the range of 7.9 to 5.0.

After forming the SiBN film, the execution of SPA nitridation selectively nitrides the SiBN film on the upper surface of the floating gate electrode 4a and converts the SiBN film to a silicon nitride film allowing increase in dielectric constant as in the first embodiment. Thereafter, a memory cell transistor can be formed by pursuing the manufacturing steps as in the first embodiment.

By pursuing the above described manufacturing steps, control of dielectric constant of the silicon nitride film 6a, functioning as an inter-poly insulating film, can be carried out by controlling the amount of nitridation in the SPA nitridation process and the dielectric constant of the insulating films over the STI 2 can be controlled by the B density of the SiBN film respectively. As a result, the device can he designed and controlled with more ease, thereby resulting in less consumption of electricity in the device and less occurrence of malfunctioning.

The present disclosure is not limited to the foregoing embodiments but may be modified or expanded as follows.

In the above described embodiments, only a single layer of silicon oxide film is formed upon formation of the inter-gate insulating film 6; however, a silicon nitride film or the like, may be laminated over the silicon oxide film and SPA nitridation process may be performed thereafter.

The foregoing description and drawings are merely illustrative of the principles of the present disclosure and are not to be construed in a limited sense. Various changes and modifications will become apparent to those of ordinary skill in the art. All such changes and modifications are seen to fall within the scope of the disclosure as defined by the appended claims.

What is claimed is:

1. A semiconductor device, comprising:
a semiconductor substrate including a first upper surface having an element forming region and an element isolation region being adjacent to the element forming region, the element isolation region having a trench;
an element insulating film formed in the trench, including a second upper surface being higher than the first upper surface of the semiconductor substrate in the element forming region and a first side surface protruding from the first upper surface;

a gate insulating film formed on the first upper surface of the semiconductor substrate in the element forming region;

a floating gate electrode formed on the gate insulating film, including a third upper surface being higher than the second upper surface related to the first upper surface, a lower side surface facing to the first side surface and an upper side surface exposed from the element insulating film;

an inter-gate insulating film formed on the third upper surface and the upper side surface of the floating gate electrode and the second upper surface of the element insulating film, the inter-gate insulating film including a first portion located on the third upper surface of the floating gate electrode and a second portion located on the second upper surface of the element insulating film; and a control gate electrode formed on the inter-gate insulating film, wherein the first portion of the inter-gate insulating film includes a silicon nitride film and the second portion of the inter-gate insulating film includes a silicon oxide film that does not contain a nitride.

2. A method of manufacturing a semiconductor device, comprising:

forming a gate insulating film and a film serving as a floating gate electrode on a semiconductor substrate;

forming an element isolation region by defining a trench on the semiconductor substrate and filling the trench with an insulating film;

processing a height of an upper surface of the element isolation region to be lower than an upper surface of the film serving as the floating gate electrode;

forming a silicon oxide film serving as an inter-gate insulating film over entire surface;

nitriding the silicon oxide film serving as the inter-gate insulating film located on the film serving as the floating gate electrode except a portion located on the element isolation region; and forming a film serving as a control gate electrode.

3. The method of claim 2, wherein, the nitriding of the silicon oxide film serving as the inter-gate insulating film is carried out by radiating radical nitrogen or ionized nitrogen.

4. The semiconductor device according to claim 1, wherein the floating gate electrode includes a polycrystalline silicon film.

5. The semiconductor device according to claim 1, wherein the control gate electrode includes a polycrystalline silicon film formed on the inter-gate insulating film and a silicide film formed on the polycrystalline silicon film.

6. The semiconductor device according to claim 1, wherein the inter-gate insulating film includes a third portion formed on the upper side surface of the floating gate electrode between the first and second portions, the third portion having an upper silicon nitride portion and a lower silicon nitride portion which is located at a position that is near the second portion, a thickness of the upper silicon nitride portion being greater than a thickness of the lower silicon nitride portion.

7. The method of claim 2, wherein the film serving as the floating gate electrode comprises an amorphous silicon film.

8. The method of claim 2, wherein the film serving as the control gate electrode comprises an amorphous silicon film.

9. The method of claim 2, further comprising forming a silicon nitride film on the silicon oxide film before the nitridation of the silicon oxide film.

* * * * *